United States Patent
Hames

[19]

[11] Patent Number: 6,100,160
[45] Date of Patent: Aug. 8, 2000

[54] OXIDE ETCH BARRIER FORMED BY NITRIDATION

[75] Inventor: Greg A. Hames, Dallas, Tex.

[73] Assignee: Texas Instruments Incorporated, Dallas, Tex.

[21] Appl. No.: 09/024,809

[22] Filed: Feb. 17, 1998

Related U.S. Application Data

[60] Provisional application No. 60/039,281, Feb. 28, 1997.

[51] Int. Cl.[7] .................................................. H01L 21/76
[52] U.S. Cl. .......................... 438/424; 438/440; 438/769
[58] Field of Search .................................... 438/440, 424, 438/305, 437, 259, 769; 257/516, 522

[56] References Cited

U.S. PATENT DOCUMENTS

| 5,403,786 | 4/1995 | Hori ......................................... 438/238 |
| 5,422,300 | 6/1995 | Pfiester et al. ........................... 438/439 |
| 5,677,234 | 10/1997 | Koo et al. ................................ 438/440 |

OTHER PUBLICATIONS

Hisham Z. Massoud, he Onset of the Thermal Oxidation of Silicon from Room Temperature to 1000 c., MicroElectronic Engineering, pp. 109–116, Dec. 1995.

*Primary Examiner*—Wael Fahmy
*Assistant Examiner*—William David Coleman
*Attorney, Agent, or Firm*—W. James Brady III; Frederick J. Telecky, Jr.

[57] ABSTRACT

A structure and method for slowing down the etch rate of CVD oxide film 230 relative to the etch rate of thermal oxide 210 to prevent excessive removal of CVD oxide 230 during the stripping of the thermal oxide 210. Nitridation has been shown to be effective at retarding the etch rate of oxides. Therefore, nitridation of the CVD oxide 230 decreases the amount of oxide loss when thermal oxide 210 is etched. Nitridation of the wafer surface can be performed either before or after the nitride 200 removal step in standard process flows. In processes that use a densified CVD oxide 230, the densification of the CVD film 230 can be performed in an ambient that incorporates nitrogen in the film to significantly decrease the etch rate of the isolation oxide 230. Due to the porosity and the increased hydrogen content of the CVD oxide 230 as compared to the hydrogen content of thermal oxide 210, the nitrogen is incorporated more rapidly in the CVD oxide 230 than in the exposed thermal oxide 210. Therefore, the etch rate of the CVD 230 relative to the thermal oxide 210 (e.g. the selectivity) can approach one or even less than one.

12 Claims, 6 Drawing Sheets

OXIDE ETCH BARRIER FORMED BY NITRIDATION

This is a Non Provisional application filed under 35 USC 119(e) and claims priority of prior provisional, Serial No. 60/039,281 of inventor Greg A. Hames, filed Feb. 28, 1997.

BACKGROUND AND SUMMARY OF THE INVENTION

The present invention relates to integrated circuit structures and fabrication methods.

Background: Shallow Trench Isolation (STI)

As high performance CMOS technology is scaled down to the current 0.35–0.25 micron generation, replacing LOCOS field oxide areas with shallow chemical-vapor-deposited-dielectric-filled trenches (shallow trench isolation, or "STI") offers several potential advantages. The planar nature of this isolation scheme reduces the depth-of-field requirements for lithographic exposures, and therefore facilitates the printing of submicron features. The lack of a bird's beak encroachment on active device areas allows for a more efficient use of the silicon surface, in addition to the reduction of both the channel width bias and the narrow channel effect. Additional advantages of STI are discussed in, for example, the following reference: Davari et al., "A Variable-Size Shallow Trench Isolation (STI) Technology with Diffused Sidewall Doping for Submicron CMOS," INTERNATIONAL ELECTRON DEVICES MEETING: TECHNICAL DIGEST, p.92–5 (1988), which is hereby incorporated by reference.

Background: Chemical Vapor Deposited (CVD) Oxide

Figure 4:
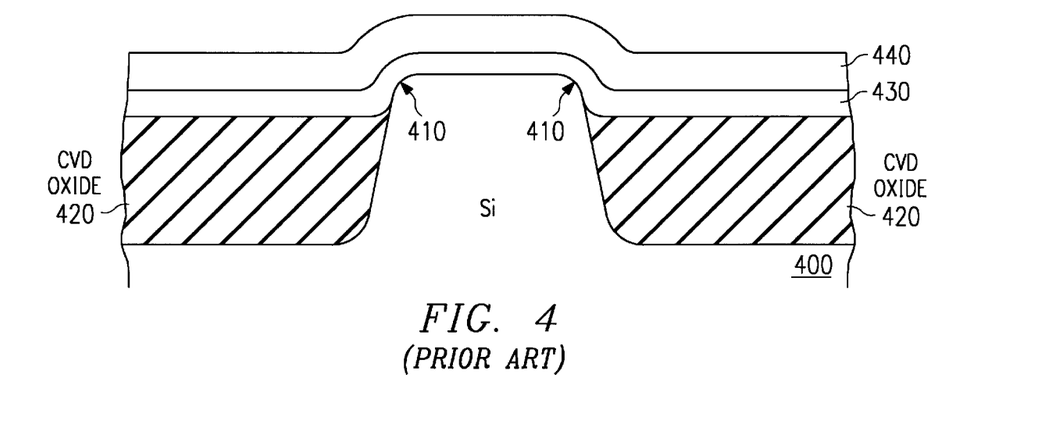
FIG. 4 shows a prior art moat structure having the corners exposed.

Since chemical vapor deposited (CVD) oxide films tend to etch at a much higher rate than standard thermal oxide, CVD oxide loss occurs during the oxide etching and cleaning steps of standard process flows. Excessive oxide loss can result in poor device isolation and degraded device performance. For example, as FIG. 2F demonstrates, during the pre-gate clean step in a device flow using CVD shallow trench isolation (STI), the pad oxide 210 (e.g. thermal oxide) must be etched in the moat (active) regions, while a CVD oxide film 230 is exposed in the field isolation regions. The CVD oxide etches more rapidly than the thermal oxide, and as can be seen in prior art FIG. 4, if an excessive amount of the CVD oxide is lost when the thermal oxide is stripped, the corners 410 at the edge of the moat regions 400 can be exposed. After the growth of the gate oxide 430 in the moat regions 400 and over the CVD oxide 420, followed by the deposition of a layer of polysilicon 440, the exposed corners 410 exhibit increased parasitic capacitance and electric field enhancement, which can lead to poor turn on characteristics of the transistor.

One conventional approach to the problem of fast etching of the CVD oxide film consists of densifying the physical structure of the CVD film. Densification of CVD oxide makes it more resistant to etching, and therefore the etch rate of the CVD oxide can be decreased such that it is only 1.5 to 2 times faster than thermal oxide. (Without densification, the etch rate of CVD oxide is approximately 10 times faster than the etch rate of thermal oxide.)

Annealing in an H2O ambient is known to be one of the most effective densification methods, as discussed in: Lee et al., "An Optimized Densification of the Field Oxide for Quarter Micron Shallow Trench Isolation (STI)," 1996 SYMPOSIUM ON VLSI TECHNOLOGY: DIGEST OF TECHNICAL PAPERS, p.158–9 (1996), which is hereby incorporated by reference. However, although the H2O ambient oxidation is more effective in terms of the resistance against the HF etching, volume expansion by the trench sidewall oxidation generates a large amount of stress in the narrow isolation region. A nitrogen (N2) gas ambient annealing at high temperature provides a viable alternative to H2O ambient annealing because N2 annealing generates a lesser amount of stress and demonstrates a lower HF etch rate.

However, for many applications, such as pre-gate sacrificial oxide stripping for STI, pad oxide stripping, split gate processes, and de-glaze processes, the etch rate of the CVD film must be nearly equal to that of the thermal oxide. Thus, in these applications, densification of the CVD oxide does not sufficiently reduce the etch rate of the CVD film. Furthermore, other processes which occur after densification of the CVD oxide, such as ion implantation, can increase the CVD oxide etch rate to as much as three times faster than the thermal oxide etch rate. Therefore, additional densification procedures may need to be performed to reduce the CVD oxide etch rate to previous levels (e.g. approximately twice the etch rate of thermal oxide).

OXIDE ETCH BARRIER STRUCTURES AND METHODS

The present application discloses a structure and method that slows down the etch rate of the CVD field oxide film relative to the thermal oxide. Nitridation has been shown to be effective at retarding the etch rate of oxides. Therefore, nitridation of the field oxide can decrease the amount of oxide loss during the thermal oxide stripping process. Nitridation of the wafer surface can be performed either before or after the nitride removal step in standard process flows. In processes that use a densified CVD oxide, the densification of the CVD film can preferably be performed in an ambient that incorporates nitrogen in the film to significantly decrease the etch rate of the isolation oxide. Due to the porosity and the increased hydrogen content of the CVD oxide (e.g. 5 percent atomic) as compared to the hydrogen content of thermal oxide (less than one percent atomic), nitrogen is incorporated more rapidly in the CVD oxide than in the exposed thermal oxide. Therefore, the etch rate of the CVD relative to the thermal oxide (e.g. the selectivity) can approach one or even less than one.

Advantages of the disclosed methods and structures include:

- reduces the etch rate of CVD oxide relative to thermal oxide; prevents excessive field oxide loss during pre-gate clean steps in which the thermal oxide is stripped;
- enables a sacrificial oxide to be grown and stripped prior to the gate oxide deposition without significant field oxide loss;
- nitridation can be performed simultaneously with the densification process; and
- nitride present at corners of moat increases the dielectric constant of the oxide and therefore reduces the electric field effects.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Oxide loss in processing of shallow trench isolation (STI) devices can lead to degradation in the yield and performance of integrated circuits. Deposited oxides used for STI tend to etch faster than thermal oxides, and therefore when the thermal oxide is removed from portions of the wafer, a large amount of deposited oxide can be lost from the wafer. Nitridation of the wafer surface either before or after the nitride removal step in standard processes can slow down the etch rate of the CVD film relative to the thermal oxide to prevent the excessive loss of oxide.

First Process Embodiment: Nitridation After Nitride Removal

In 0.35–0.25 micron devices, CVD oxide (typically TEOS-derived) has begun to replace thermal oxide for device isolation. As CVD oxide etches at a faster rate than thermal oxide, it has become increasingly difficult to fabricate structures with a completely planar topography. Through various processing steps, portions of the CVD oxide are removed from the surface. In order to produce a structure that does not have exposed portions near the corners of the moat region, no more than approximately 100 nm of the CVD oxide can be lost with typical 0.25 micron dimensions. Most of the CVD oxide loss (e.g. 40–70 nm) occurs during the pad oxide strip step. Therefore, in accordance with preferred embodiments of the present invention, the CVD oxide is nitrided to lower its etch rate relative to the etch rate of thermal oxide to prevent excessive loss of the CVD oxide.

Figure 1:
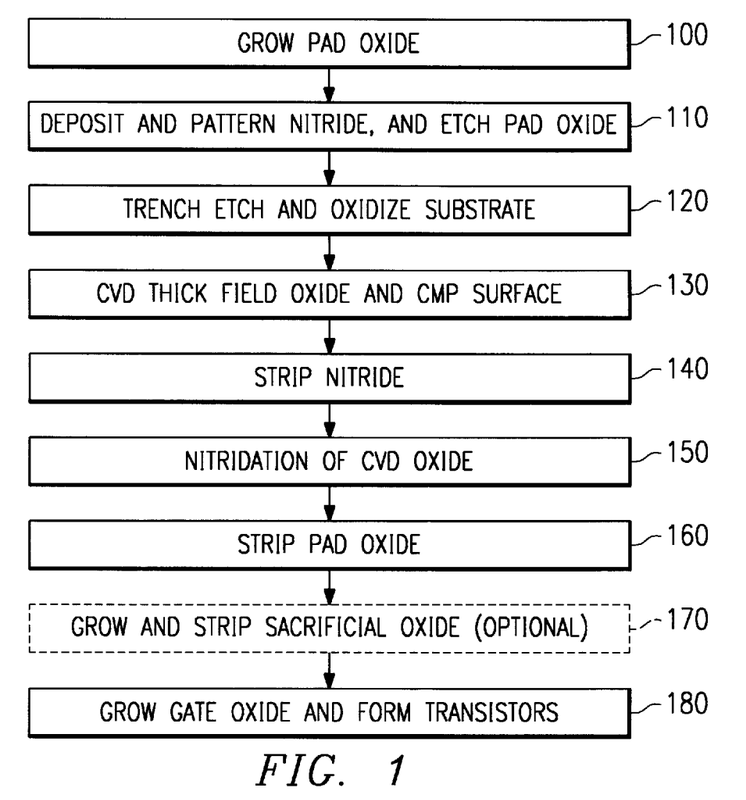
FIG. 1 shows a flow chart for incorporating nitrogen into CVD oxide films.
Figure 2A:
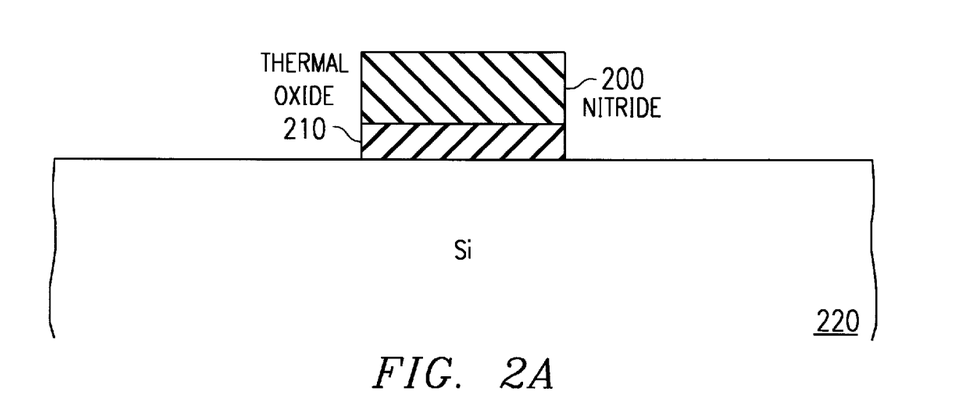
FIGS. 2A–2I schematically illustrate the formation of a shallow trench isolation device using preferred embodiments of the present invention.

FIG. 1 shows a process flow for fabricating an integrated circuit structure, and FIGS. 2A–2I show the formation of a shallow trench isolation device in accordance with embodiments of the present invention. Growth of the thermal pad oxide 210 (step 100), which has a thickness around 15 nm, on the substrate 220 (e.g. silicon), is followed by the depositing and patterning of a silicon nitride film 200, which has a thickness between 80 and 200 nm. Thereafter, the pad oxide 210 is etched (step 110), using the patterned nitride 200 as an etch mask, to expose locations on the substrate 220 where the field oxide will be deposited, as can be seen in FIG. 2A. The refractive index of the CVD field oxide can vary from 1.4 to 1.5, while the refractive index for the thermal pad oxide is 1.46.

Figure 2B:
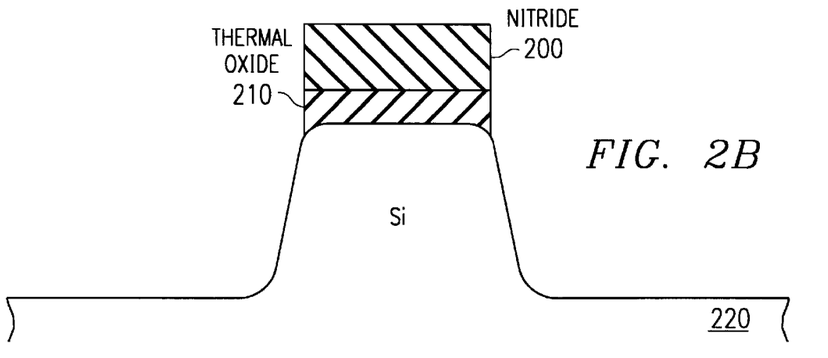
Figure 2C:
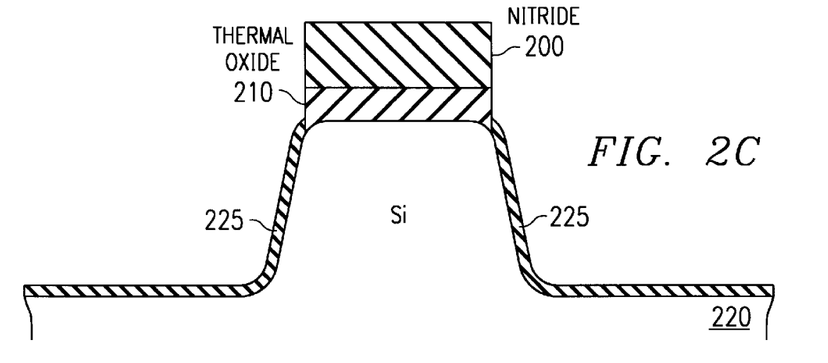
Figure 2D:
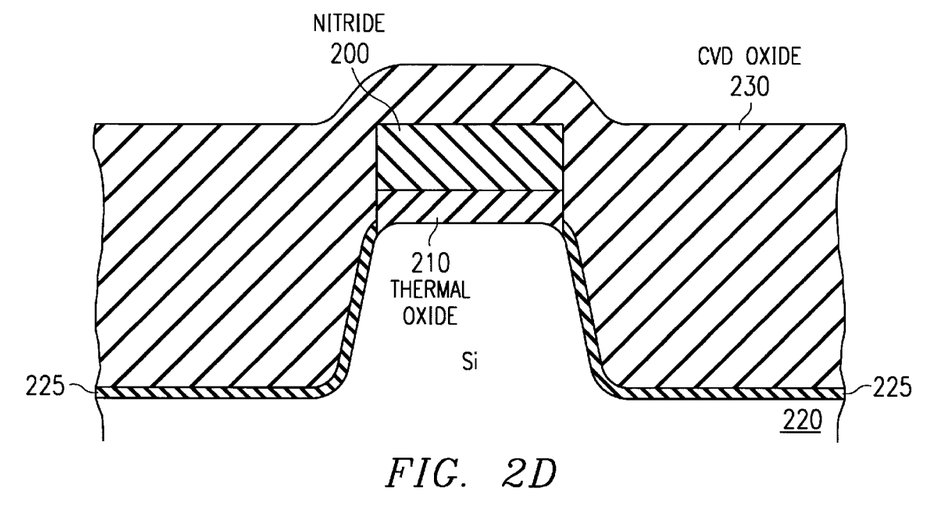
Figure 2E:
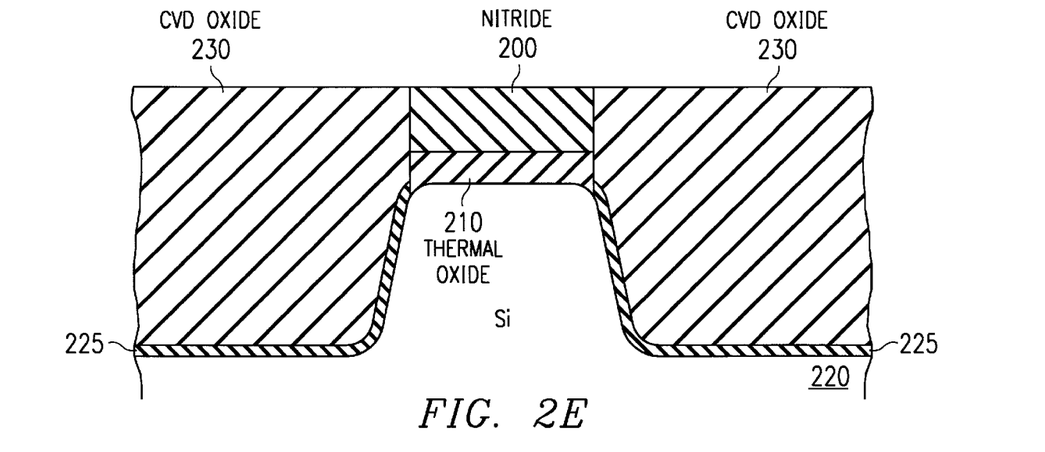

Subsequently, with the patterned nitride 200 and pad oxide 210 still in place, a trench etch is performed on the substrate 220 to remove approximately 600 nm of silicon in areas not covered by the pad oxide 210, shown in FIG. 2B. The structure is then slightly oxidized (step 120) to form only about 10 to 40 nm of thermal oxide 225 on the surface and sidewalls of the trenches, which is illustrated in FIG. 2C. The thick field oxide 230 (e.g. SiO2) is then deposited in the trenches, preferably using a CVD process (e.g., from TEOS), depicted in FIG. 2D, and planarized by chemical mechanical polishing (CMP) (step 130) to expose the nitride mask 200 while controlling the relative heights of the active areas and field areas, as can be seen in FIG. 2E. The final height of the field oxide 230 must be higher than that of the active silicon 220 under the nitride mask 200, but not high enough to produce a substantial step. The CMP process typically removes up to several hundred nanometers of the field oxide 230.

Figure 2F:
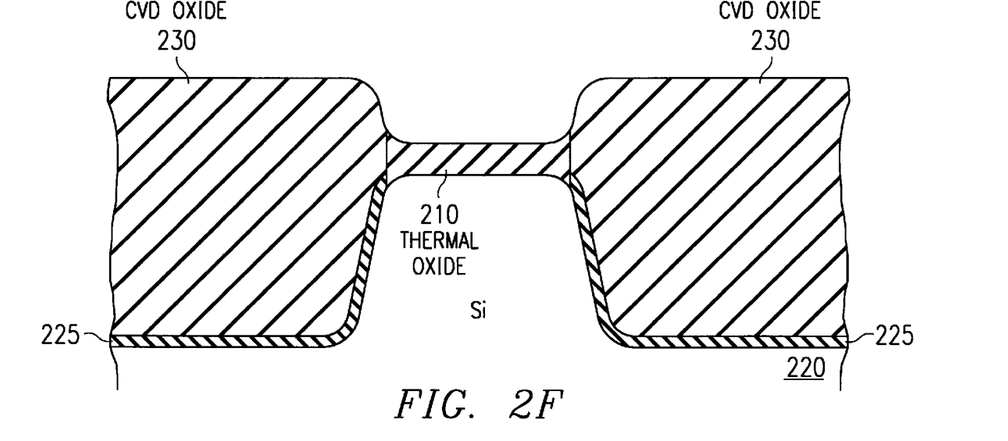
Figure 2G:
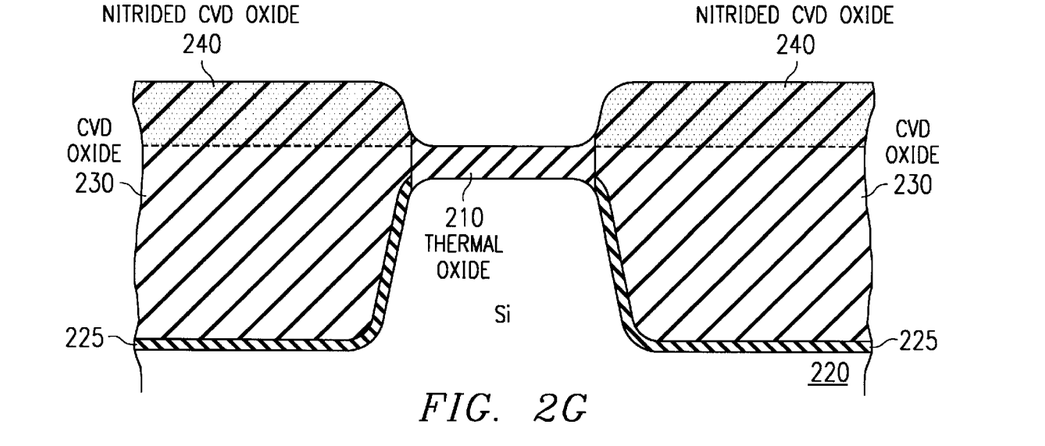

Subsequently, the nitride 200 is stripped (step 140), using phosphoric acid (H3PO4) at 160 degrees C., shown in FIG. 2F, which can also remove around 5 nm of the thick field oxide 230. In order to prevent further loss of the field oxide 230, as FIG. 2G illustrates, the CVD film 230 is now nitrided (step 150), in accordance with one of the nitridation embodiments listed below, to form a surface layer of nitrided CVD oxide 240.

Figure 5A:
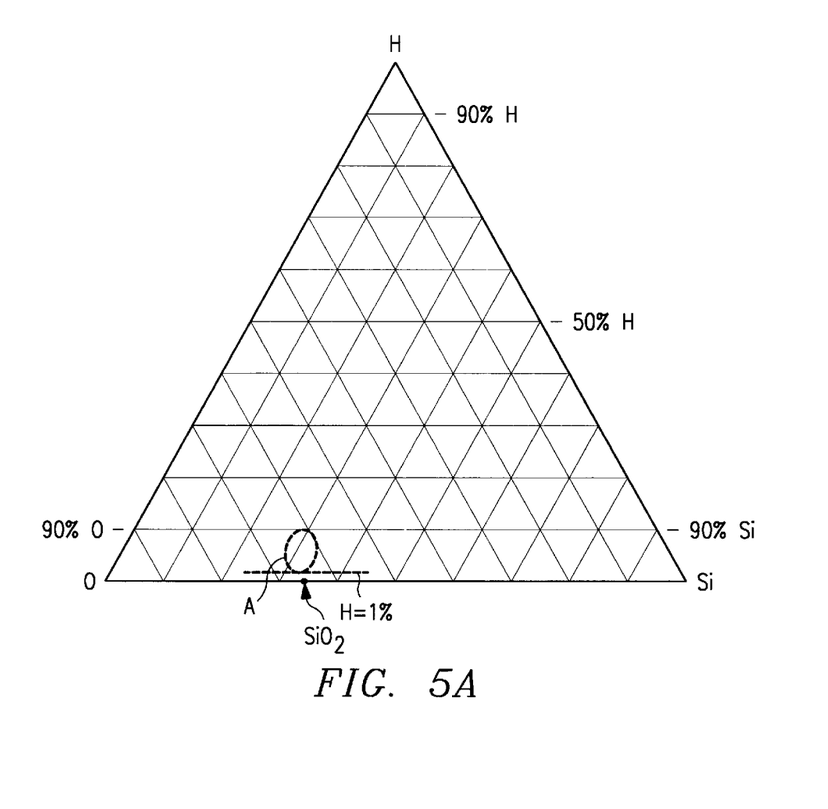
FIGS. 5A and 5B are Gibbs diagrams illustrating the increased hydrogen content of the CVD oxide relative to the thermal oxide.
Figure 5B:
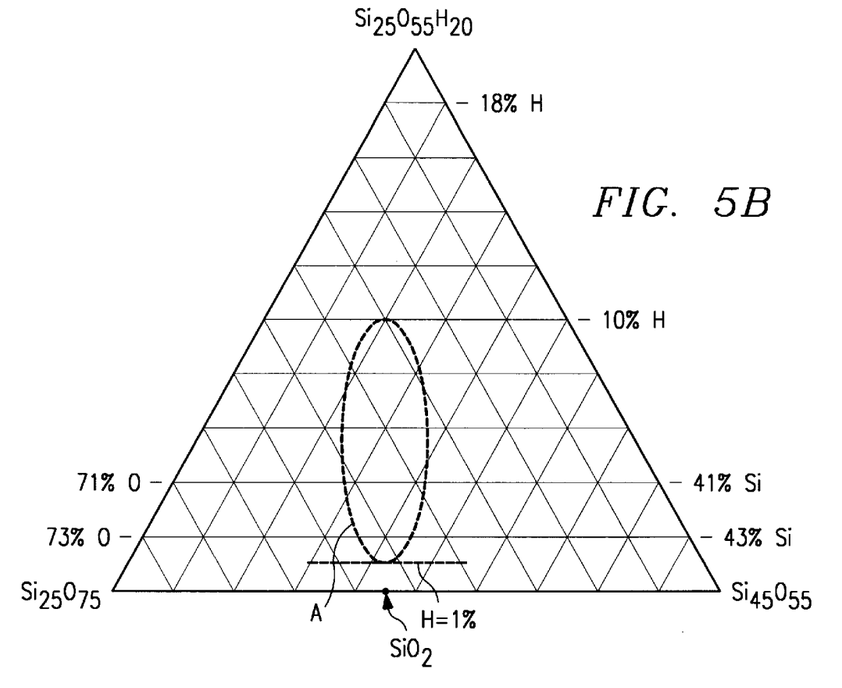

The increased hydrogen content of CVD oxide 230 as compared to thermal oxide 210 allows the nitrogen to be incorporated more quickly into the CVD film 230, because the hydrogen de-passivates the dielectric material and/or passivates any dangling bonds of the introduced nitrogen. As shown in the ternary composition (Gibbs) diagrams of FIGS. 5A and 5B, the hydrogen content of CVD oxide preferably ranges from between one and ten percent atomic, depicted by the outlined region A, while the thermal oxide typically has a hydrogen content less than one percent. (In pure oxygen grown gate oxides, the hydrogen content is in the parts per million, while for steam grown thermal field oxides, which grow much faster than oxygen-grown oxide, the hydrogen content is in the parts per thousand). The depth of the nitride can be varied depending on whether nitrided CVD oxide is desired in subsequent processing steps.

Figure 6:
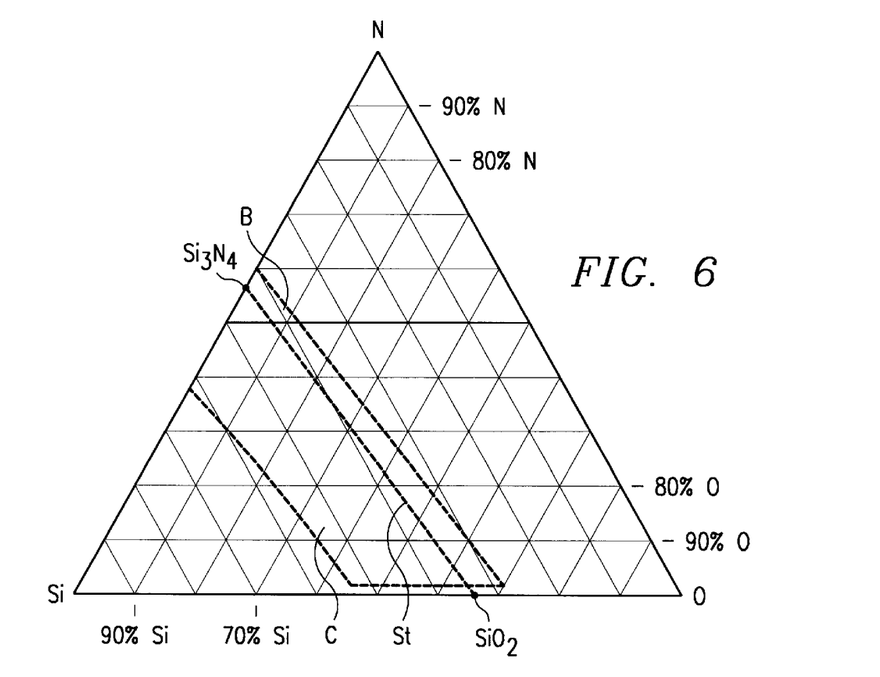
FIG. 6 is a Gibbs diagram showing the nitrogen content of nitrided CVD oxide.

Furthermore, as shown in the Gibbs diagram of FIG. 6, the nitrided CVD oxide can be a silicon-rich oxynitride, depicted by the region C, which ranges from the line of stoichiometric oxynitride St (e.g. from SiO2 to Si3N4) to compositions having approximately twenty percent additional atomic of silicon, or a silicon-poor oxynitride, shown by the region B, which ranges from line St to compositions having around five percent less atomic of silicon, in addition to being a stoichiometric oxynitride (line St). Both regions (B and C) require a minimum nitrogen content of at least one percent atomic. (The hydrogen content of the CVD oxide is not shown).

Figure 2H:
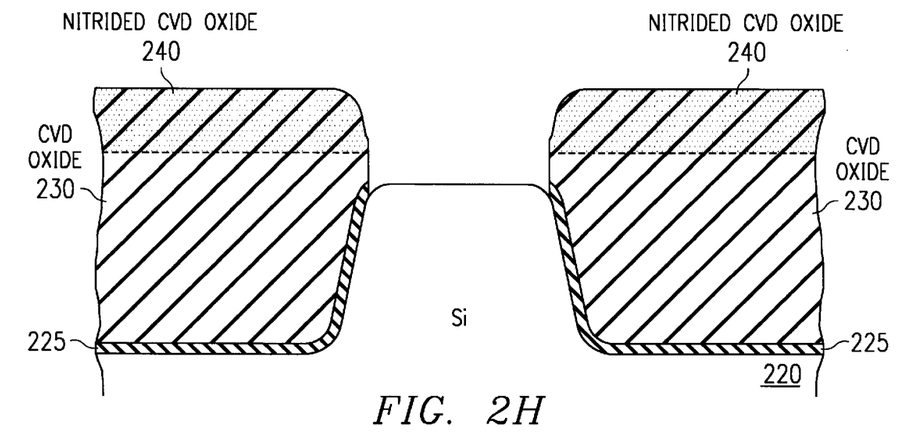
Figure 2I:
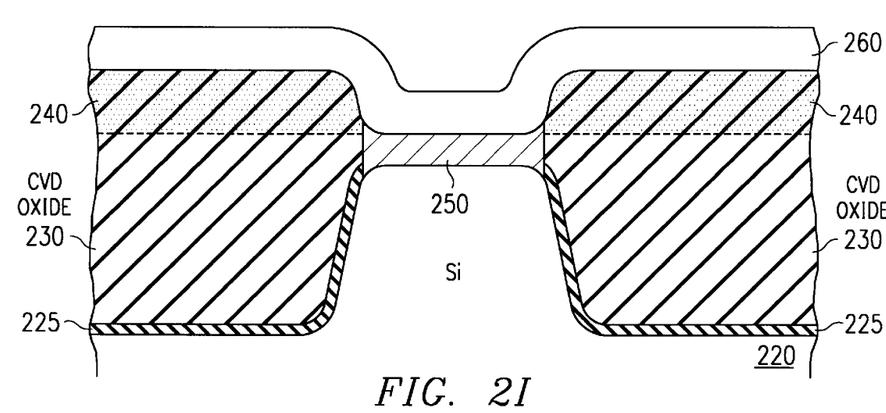

Following this nitridation step (step 150), the thermal oxide 210 is stripped (step 160), using, for example, 49 percent aqueous HF diluted 100:1 with "DI" (ultrapure) water, as shown in FIG. 2H. The surface of the CVD oxide 240, which has been nitrided, can easily be removed after the thermal oxide strip (step 160) with selectivity to the remaining oxide 230. However, nitrided CVD oxide 240 present at the corners of the moat region 220 increases the dielectric constant of the oxide, which advantageously reduces the electric field. Therefore, it may be desirable to not remove the nitrided CVD film 240 at the surface of the field oxide 230. Optionally, and advantageously, by leaving the nitrided CVD oxide 240 intact, a sacrificial oxide can then be grown in the moat region and stripped (optional step 170) to produce a smooth surface on which to grow a thinner gate oxide, without any excessive loss of the field oxide. Finally, the gate oxide 250 is grown in the moat regions 220 followed by the conformal deposition of a layer of polysilicon 260, which is illustrated in FIG. 2I, and the traditional formation of transistors (step 180).

Second Process Embodiment: Densification of CVD Oxide

In processes that require a densified field oxide material, the nitridation of the CVD film can take place before, during, or after the densification process. Densification of dielectric materials traditionally involves placing the wafers in an inert nitrogen atmosphere at temperatures up to 900 to 1000 degrees C.

Preferably, the CVD oxide is both densified and nitrided simultaneously to reduce the number of processing steps. This is accomplished by performing the densification in an ambient that incorporates nitrogen into the film. However, if the oxide is alternatively densified before the nitriding occurs, a lesser amount of nitrogen is incorporated into the CVD film, resulting in an etch rate that is not significantly lowered with respect to the thermal oxide etch rate.

Due to the porosity and hydrogen content of the CVD oxide, the CVD film incorporates nitrogen more rapidly than the exposed thermal oxide. Therefore, by densifying and nitriding simultaneously, the etch rate of the CVD oxide can approach the etch rate of the thermal oxide, and (if nitridation is sufficiently prolonged) can be reduced to an etch rate that is lower than the etch rate of the thermal oxide.

Third Process Embodiment: Nitridation Before Nitride Removal

Figure 3:
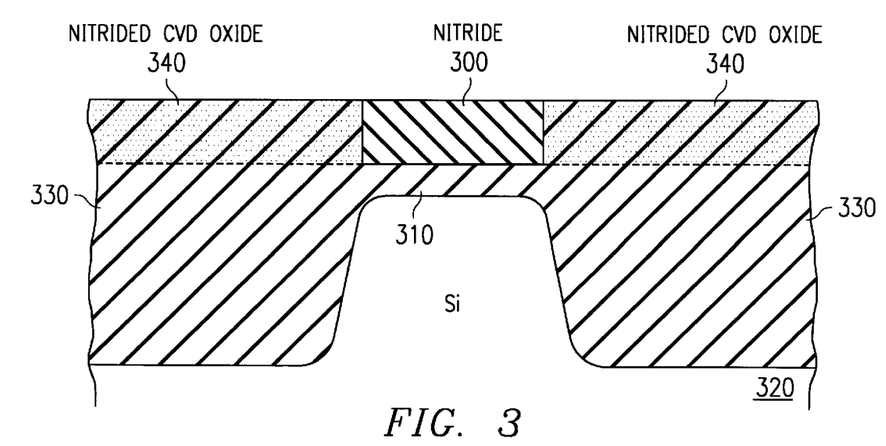
FIG. 3 shows a moat structure having a layer of nitrided CVD oxide in accordance with one embodiment of the present invention.

Alternatively, and less preferably, the nitridation of the CVD oxide can occur prior to the stripping of the nitride layer. Performing the nitridation of the wafer before the nitride removal step produces a self-aligned nitridation of the CVD isolation. After the chemical mechanical polishing (CMP) of the wafer, the resulting structure, as shown in the cross-sectional view of the wafer in FIG. 3, includes a layer of nitride 300 that overlies the thermal oxide 310 in the moat region 320 between the areas of field isolation 330.

However, nitridation before the nitride strip forms a self-limiting nitride layer on the surface of the wafer, which can undesirably prevent the nitrogen from diffusing into the CVD film. One solution to this problem, shown in FIG. 3, involves using an un-densified or not completely densified CVD film 330 in order to allow the nitrogen to penetrate further into the isolation film 340. Therefore, the etch rate of the CVD oxide 330 can be lowered relative to the thermal oxide 310, which precludes the excessive removal of the CVD oxide 330 during the stripping of the thermal oxide 310. Some of the nitrided CVD film 340 will be lost in the subsequent nitride 300 strip step, but the high oxygen level in the film helps to reduce the loss of the nitrided CVD film 340.

Fourth Process Embodiment: Selective Epi

The nitridation, and thus the hardening, of oxide can also be performed during selective epi isolation processes, in which a global CVD oxide is etched to expose areas of underlying silicon. In this process, after the etching of the CVD oxide, silicon is epitaxially grown in the exposed locations until the silicon is coplanar with the oxide. Thereafter, a sacrificial oxide is grown over the silicon, followed by the stripping of the sacrificial oxide and the growth of the gate oxide. Excessive loss of the CVD oxide during the stripping of the thermal oxide can be prevented by nitriding the CVD oxide prior to etching the CVD oxide.

Fifth Process Embodiment: Nitriding Oxyfluoride

Alternatively, nitrided silicon-oxyfluoride can be used instead of nitrided CVD oxide for device isolation. Oxyfluoride also has a higher etch rate than thermal oxide, and therefore the etch rate can advantageously be reduced by nitriding the surface of the oxyfluoride. Processing conditions are otherwise similar to those used with CVD oxide.

Sixth Process Embodiment: No Sacrificial Oxide

Alternatively, a sacrificial oxide is not grown and stripped in the moat regions. The gate oxide is grown on the silicon exposed after the pad oxide is stripped, which is followed by the traditional formation of transistors.

First Nitridation Embodiment: NH3 Annealing

In one preferred embodiment, the CVD oxide can be nitrided by annealing in a NH3 ambient (e.g. at atmospheric pressure). By using NH3, the thickness of the nitrided region of the CVD oxide can reach at least 10 nm, thus producing a heavily nitrided surface area. This thick nitride portion significantly decreases the etch rate of the CVD oxide to a rate comparable with the thermal oxide etch rate, and possibly to an etch rate lower than the thermal oxide rate. Thus, a planar topography without any exposure at the corners of the moat regions can be effectuated. However, nitrogen incorporation using NH3 annealing is non-uniform, resulting in a high nitrogen concentration both at the surface and at the bottom of the layer.

Second Nitridation Embodiment: N2 Plasma Nitridation

Alternatively, in another preferred embodiment, the nitridation can be performed using a plasma activated nitrogen anneal. Molecular nitrogen (N2) is typically not reactive enough to form the desired nitridation, and therefore the very reactive species produced by a plasma discharge (e.g. excited and/or atomic nitrogen) can be used. However, these species are so reactive that only a thin nitrided surface layer, typically on the order of one nanometer, of nitrided CVD oxide is predicted to be produced using plasma nitrogen. This thin layer of hardened oxide lowers the CVD oxide etch rate and hence reduces the net erosion of the CVD oxide, but is easily removed during the thermal oxide strip step. Therefore, after subsequent processing steps, there will typically not be a layer of nitrided CVD oxide.

Third Nitridation Embodiment: Anneal plus Plasma Nitridation

Optionally, a plasma activated anneal (e.g. NH3, N2, or other nitrogen source) can be used after the NH3 anneal in order to produce a CVD oxide which has a diffuse nitrogen content and also has a hardened (nitride-rich) surface.

Fourth Nitridation Embodiment: N2O Annealing

In an alternative predicted embodiment, the CVD oxide can be nitrided by annealing in a N2O ambient to reduce the etch rate of the CVD oxide as compared to the etch rate of the thermal oxide. Processing conditions are otherwise similar to other embodiments given.

Fifth Nitridation Embodiment: NO Annealing

Alternatively, by annealing in a nitric oxide (NO) ambient, it is predicted that a nitrided layer will form at the surface of the CVD oxide, which can advantageously reduce the etch rate of the CVD film. Processing conditions are otherwise similar to other embodiments given.

Sixth Nitridation Embodiment: NF3 Annealing

Alternatively, by annealing in a NF3 ambient, it is predicted that nitrogen can also be incorporated into the CVD oxide to reduce the etch rate. However, this process is less preferred due to the fact that NF3 is highly reactive. Processing conditions are otherwise similar to other embodiments given.

Seventh Nitridation Embodiment: NOF Annealing

Optionally, it is predicted that alternative chemistries that have a lower reactivity than NF3, such as NOF, can be used during the nitriding of the field oxide. Processing conditions are otherwise similar to other embodiments given.

Eighth Nitridation Embodiment: Nitrogen Implantation

Alternatively, a nitrided CVD oxide surface is predicted to be achieved by implanting nitrogen into the film. However, the depth of implantation is limited by the pad oxide thickness (only about 10–15 nm), and thus the process must be carefully controlled.

First Thermal Oxide Strip Embodiment: HF

The thermal pad oxide is preferably stripped using an aqueous HF source (e.g. 49 percent aqueous HF diluted at a ratio in the range of 10:1 to 1000:1). During this strip step, the amount of CVD field oxide loss is minimized by nitriding the CVD film in accordance with preferred embodiments of the present invention.

Second Thermal Oxide Strip Embodiment: Buffered HF

Alternatively, the thermal oxide can be stripped using buffered HF (aqueous HF buffered with ammonium fluoride), which provides an improved (lower) selectivity of CVD to thermal oxide.

Third Thermal Oxide Strip Embodiment: Dry Etch

In an alternative contemplated embodiment, it is predicted that the thermal oxide can be removed by dry etching using a fluorine chemistry with reduced loss of the thick field dielectric layer, due to the hardened (nitrided) surface of the CVD field oxide.

According to a disclosed class of innovative embodiments, there is provided: a method of fabricating an integrated circuit structure, comprising the steps of: (a.) forming a thick field dielectric comprising silicon and oxygen; (b.) at least partially nitriding the surface of said thick field dielectric to provide a nitrogen-containing composition at the surface thereof; (c.) growing a gate oxide layer in at least some places not covered by said thick field dielectric; and (d.) forming transistors in said places.

According to another disclosed class of innovative embodiments, there is provided: a method of hardening a chemical vapor deposited oxide, comprising the steps of: (a.) providing a partially fabricated integrated circuit structure having areas of thermal silicon oxide separating adjacent areas of chemical vapor deposited silicon oxide; (b.) nitriding said structure to incorporate nitrogen into said areas of silicon oxide; (c.) stripping said areas of thermal oxide; and (d.) growing a gate oxide in places where said areas of thermal oxide layer were stripped; wherein said nitriding step decreases the etch rate of said areas of silicon oxide relative to the etch rate of said areas of thermal oxide during said stripping step; whereby excessive loss of said areas of silicon oxide is prevented during said step of stripping said areas of thermal oxide.

According to a disclosed class of innovative embodiments, there is provided: an integrated circuit structure, comprising: a thick field dielectric comprising silicon and oxygen having at least five percent atomic of nitrogen at a depth near the surface thereof; and transistors in at least some locations not covered by said thick field dielectric.

MODIFICATIONS AND VARIATIONS

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

Of course, the specific etch chemistries, layer compositions, and layer thicknesses given are merely illustrative, and do not by any means delimit the scope of the claimed inventions.

The thick field oxide can be deposited by various methods, including, but not limited to, high density plasma, SACVD (subatmospheric CVD), and LPCVD (low pressure CVD).

Alternatively and less preferably, other derivatives of ammonia or NF3 can be used to decrease the etch rate of CVD oxide relative to thermal oxide, such as NH2F, and NCl2F.

An alternative contemplated embodiment is to use plasma etch damage to equalize the etching rates of CVD and thermal oxide. This can be done, for example, by striking a plasma in an argon atmosphere at relatively low pressure and at a significant applied bias power. The effect of the resulting damage on the thermal oxide will accelerate its etch rate, while increasing the etch rate of the CVD oxide by a smaller percentage, and thus the ratio of etching rate between the two oxides will be made closer to 1:1. However, this embodiment is distinctly less preferred than the embodiments discussed above.

What is claimed is:

1. A method of fabricating an integrated circuit structure, comprising the steps of:
   a. forming a thick field dielectric comprising silicon and oxygen;
   b. at least partially nitriding the surface of said thick field dielectric to provide a nitrogen-containing composition at the surface thereof;
   c. growing a gate oxide layer in at least some places not covered by said thick field dielectric; and
   d. forming transistors in said places.

2. The method of claim 1, wherein said step of nitriding is performed by annealing in a NH3 ambient.

3. The method of claim 1, wherein said step of nitriding is at least partially performed by using a plasma activated nitrogen anneal.

4. The method of claim 1, wherein said thick field dielectric has a hydrogen content between one and ten percent atomic.

5. A method of hardening a chemical vapor deposited oxide, comprising the steps of:
  a. providing a partially fabricated integrated circuit structure having areas of thermal silicon oxide separating adjacent areas of chemical vapor deposited silicon oxide;
  b. nitriding said structure to incorporate nitrogen into said areas of chemical vapor deposited silicon oxide;
  c. stripping said areas of thermal silicon oxide; and
  d. growing a gate oxide in places where said areas of thermal silicon oxide were stripped;
  wherein said nitriding step decreases the etch rate of said areas of chemical vapor deposited silicon oxide relative to the etch rate of said areas of thermal silicon oxide during said stripping step;
  whereby excessive loss of said areas of chemical vapor deposited silicon oxide is prevented during said step of stripping said areas of thermal silicon oxide.

6. The method of claim 5, further comprising the step of densifying said areas of chemical vapor deposited silicon oxide.

7. The method of claim 5, further comprising the step of densifying said areas of silicon oxide.

8. The method of claim 7, wherein said step of densifying is performed in an inert nitrogen atmosphere at a temperature in the range of 900 to 1000 degrees C.

9. The method of claim 5, further comprising the step, after said step of stripping, growing and stripping a sacrificial layer of thermal oxide in places where said areas of thermal oxide were stripped.

10. The method of claim 5, wherein said step of stripping is performed using buffered HF.

11. The method of claim 5, wherein said chemical vapor deposited silicon oxide has a hydrogen content between one and ten percent atomic.

12. The method of claim 5, wherein the refractive index of said thermal oxide is 1.46 and the refractive index of said chemical vapor deposited silicon oxide differs from the refractive index of said thermal oxide by at least 0.01.

* * * * *